United States Patent
Poon

(10) Patent No.: US 10,147,567 B2
(45) Date of Patent: Dec. 4, 2018

(54) PUSH-BUTTON SWITCH CAPABLE OF ADJUSTING OUTPUT POWER

(71) Applicants: Dongguan Chen Da Appliance Co., Ltd., Dongguan (CN); Defond Components Limited, Chaiwan (HK)

(72) Inventor: Kai Kei Poon, Dongguan (CN)

(73) Assignees: Defond Electech Co., Ltd., Dongguan (CN); Defond Components Limited, Chaiwan (HK)

( * ) Notice: Subject to any disclaimer, the term of this patent is extended or adjusted under 35 U.S.C. 154(b) by 0 days.

(21) Appl. No.: 15/685,858

(22) Filed: Aug. 24, 2017

(65) Prior Publication Data

US 2018/0061593 A1    Mar. 1, 2018

(30) Foreign Application Priority Data

Aug. 26, 2016   (CN) .................... 2016 2 0950019 U

(51) Int. Cl.
| | |
|---|---|
| *H01H 9/06* | (2006.01) |
| *H01H 11/00* | (2006.01) |
| *H01H 13/14* | (2006.01) |
| *H01H 13/26* | (2006.01) |
| *H01H 13/38* | (2006.01) |
| *H01H 13/42* | (2006.01) |
| *H01H 13/50* | (2006.01) |
| *H03K 17/965* | (2006.01) |

(52) U.S. Cl.
CPC ........ *H01H 11/0006* (2013.01); *H01H 13/14* (2013.01); *H01H 13/26* (2013.01); *H01H 13/38* (2013.01); *H01H 13/50* (2013.01); *H03K 17/965* (2013.01); *H01H 9/061* (2013.01); *H01H 13/42* (2013.01)

(58) Field of Classification Search
CPC .... H01H 9/061; H01H 9/063; H01H 11/0031; H01H 13/00; H01H 13/50; H01H 15/00; H01H 15/005; H01H 15/02; H01H 15/102; H01H 2009/065; H01H 2009/066
See application file for complete search history.

(56) References Cited

U.S. PATENT DOCUMENTS

| | | | |
|---|---|---|---|
| 6,717,080 B1 * | 4/2004 | Chan .................... | H01H 13/08 200/200 |
| 9,916,944 B2 * | 3/2018 | Koyama ................ | H01H 13/14 |

* cited by examiner

*Primary Examiner* — Vanessa Girardi
(74) *Attorney, Agent, or Firm* — Wang Law Firm, Inc.

(57) ABSTRACT

A push-button switch capable of adjusting output power includes a housing. The housing includes a contact assembly and a power adjustment assembly therein. The contact assembly includes an upper terminal, a lower terminal and a connecting elastic plate below the upper terminal. A support seat is provided in the housing. An upper end of the support seat is provided with a first bracket. The first bracket is inserted through the connecting elastic plate. The first bracket is provided with a first slot. One end of the connecting elastic plate is fixedly connected to the upper terminal. Another end of the connecting elastic plate is engaged with the first slot. A drive mechanism is provided above the connecting elastic plate for driving the connecting elastic plate downward. The push-button switch has an ergonomic design.

6 Claims, 2 Drawing Sheets

PUSH-BUTTON SWITCH CAPABLE OF ADJUSTING OUTPUT POWER

FIELD OF THE INVENTION

The present invention relates to a push-button switch, and more particularly to a labor-saving push-button switch capable of adjusting output power.

BACKGROUND OF THE INVENTION

A push button switch uses a button to push a drive mechanism, so that a movable contact and an immovable contact can be connected or disconnected to open or close the circuit.

Push button switches have been widely used. The requirements for the size and the ergonomic design of the push button switches are getting higher and higher. A conventional power switch having a power adjustment function is large in size. It is laborious for the operator to complete the operation of the open circuit and closed circuit. The overall operation is inconvenient, without an ergonomic design. Accordingly, the inventor of the present invention has devoted himself based on his many years of practical experiences to solve these problems.

SUMMARY OF THE INVENTION

In view of the shortcomings of the prior art, the primary object of the present invention is to provide a push-button switch capable of adjusting output power. The structure of the push-button switch is compact. Under the same condition of having the power adjustment function, the size of the push-button switch is reduced. The interior configuration of the push-button switch takes advantage of the principle of elastic deformation and restoration, so that the operator can complete the operation of the open circuit and closed circuit, without greater effort. The present invention has a labor-saving and ergonomic design.

In order to achieve the aforesaid object, the push-button switch capable of adjusting output power of the present invention comprises a housing. The housing includes a contact assembly and a power adjustment assembly therein. The contact assembly includes an upper terminal, a lower terminal and a connecting elastic plate below the upper terminal. A support seat is provided in the housing. An upper end of the support seat is provided with a first bracket. The first bracket is inserted through the connecting elastic plate. The first bracket is provided with a first slot. One end of the connecting elastic plate is fixedly connected to the upper terminal. Another end of the connecting elastic plate is engaged with the first slot. A drive mechanism is provided above the connecting elastic plate for driving the connecting elastic plate downward.

Preferably, the drive mechanism includes a press block for pressing the connecting elastic plate downward, a push rod for pushing the press block downward, and a returning mechanism for returning the push rod.

Preferably, the press block includes a press portion for pressing the connecting elastic plate and a connecting portion for driving the push rod. A lower end of the push rod is provided with a push block for pushing the press block downward.

Preferably, the connecting portion of the press block has a contact curved surface. The push block has an engaging bevel. The engaging bevel leans against the contact curved surface.

Preferably, the returning mechanism includes a spring. One end of the spring leans against the push rod. Another end of the spring leans against an inner wall of the housing.

Preferably, the drive mechanism includes an auxiliary returning mechanism. The auxiliary returning mechanism includes a returning elastic piece. The connecting elastic plate has a first receiving slot. The returning elastic piece is disposed in the first receiving slot. The upper end of the support seat is provided with a second bracket. The second bracket is inserted through the connecting elastic plate. The second bracket is provided with a second slot. One end of the returning elastic piece is connected with the connecting elastic plate. Another end of the returning elastic piece is engaged with the second slot.

Preferably, the power adjustment assembly includes a circuit board and a slider in contact with the circuit board. An upper end of the push rod is provided with a second receiving slot. The slider includes a fixed portion and a contact portion. The fixed portion of the slider is disposed in the second receiving slot. The contact portion of the slider is in contact with the circuit board.

The beneficial effects of the present invention are described below. A push-button switch capable of adjusting output power comprises a housing. The housing includes a contact assembly and a power adjustment assembly therein. The contact assembly includes an upper terminal, a lower terminal and a connecting elastic plate below the upper terminal. A support seat is provided in the housing. An upper end of the support seat is provided with a first bracket. The first bracket is inserted through the connecting elastic plate. The first bracket is provided with a first slot. One end of the connecting elastic plate is fixedly connected to the upper terminal. Another end of the connecting elastic plate is engaged with the first slot. A drive mechanism is provided above the connecting elastic plate for driving the connecting elastic plate downward.

When the drive mechanism drives the connecting elastic plate to be pressed downward, one end of the connecting elastic plate is engaged with the first slot to be immovable, and the other end connected with the upper terminal is continuously pressed downward so that the connecting elastic plate is deformed and curved. The upper terminal is in contact with the lower terminal, and the circuit is closed. When the force from the drive mechanism to press the connecting elastic plate disappears, the connecting elastic plate is restored by means of its elasticity. The upper terminal and the lower terminal are disconnected and the circuit is disconnected. The structure is compact. Under the same condition of having the power adjustment function, the size of the push-button switch is reduced. The interior configuration of the push-button switch takes advantage of the principle of elastic deformation and restoration, so that the operator can complete the operation of the open circuit and closed circuit, without greater effort. The present invention has a labor-saving and ergonomic design.

DETAILED DESCRIPTION OF THE PREFERRED EMBODIMENTS

Embodiments of the present invention will now be described, by way of example only, with reference to the accompanying drawings.

Figure 1:
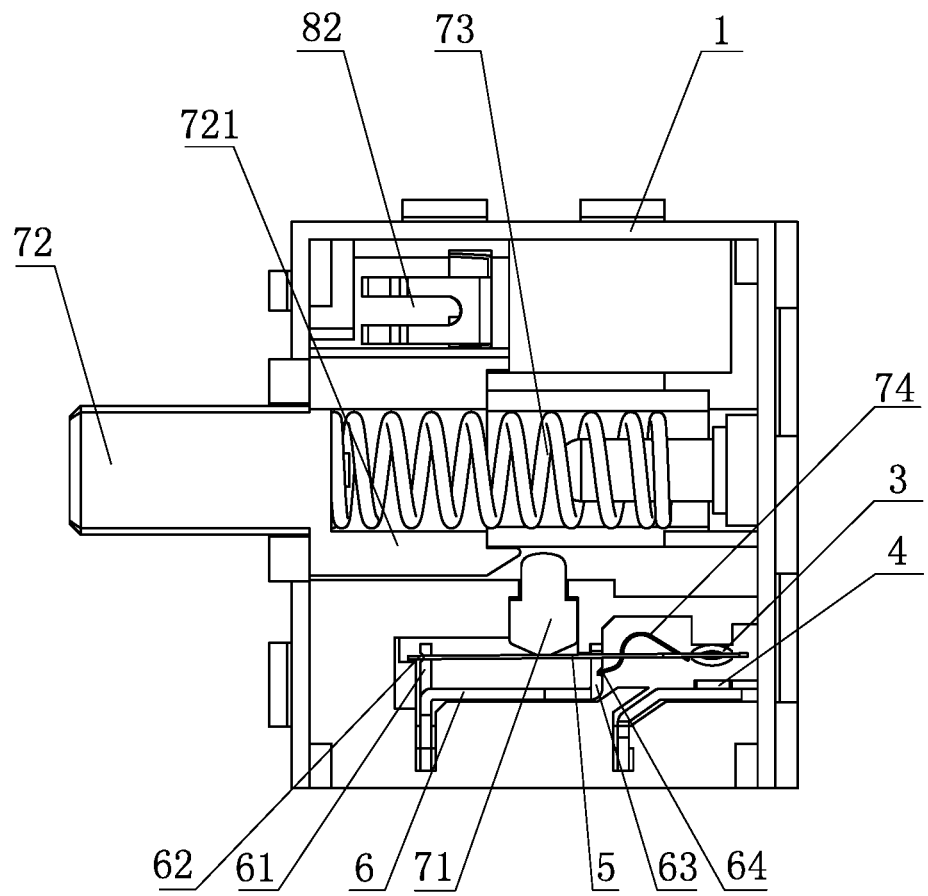
FIG. 1 is a sectional view of the present invention.
Figure 2:
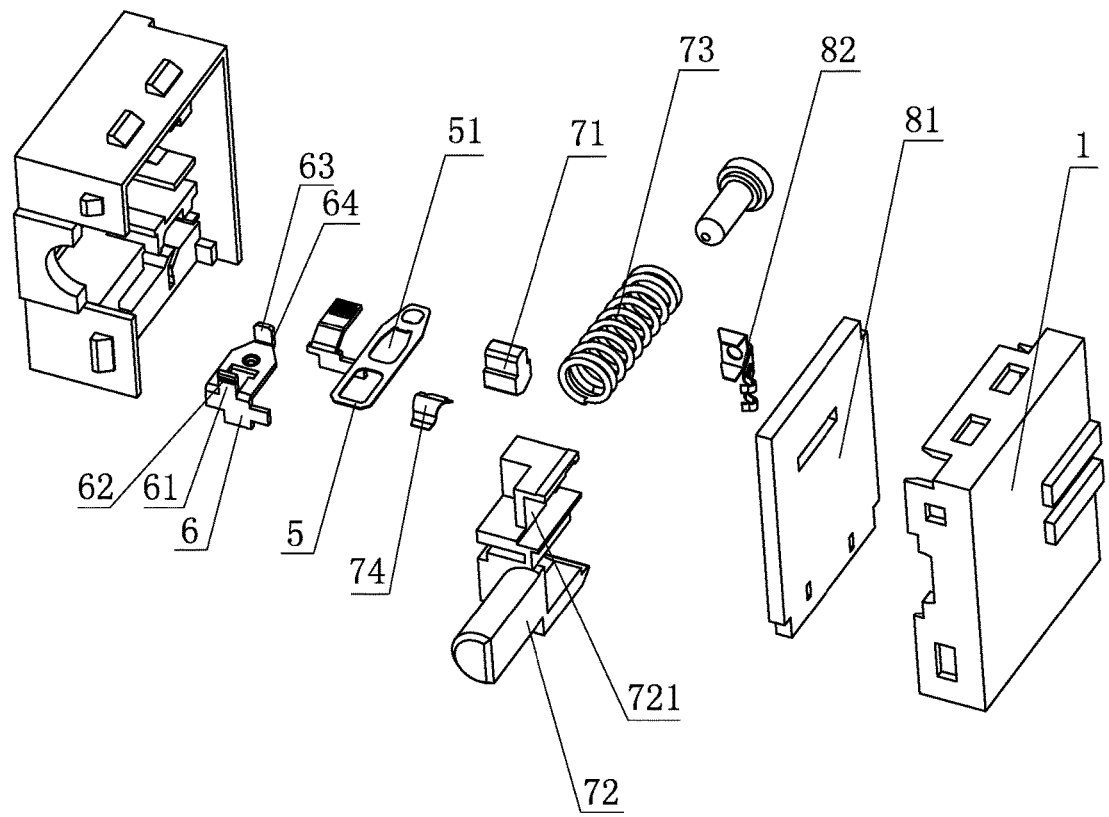
FIG. 2 is an exploded of the present invention.

As shown in FIG. 1 and FIG. 2, a push-button switch capable of adjusting output power according to an embodiment of the present invention comprises a housing 1. The housing 1 includes a contact assembly and a power adjustment assembly therein. The contact assembly includes an upper terminal 3, a lower terminal 4 and a connecting elastic plate 5 below the upper terminal 3. A support seat 6 is provided in the housing 1. An upper end of the support seat 6 is provided with a first bracket 61. The first bracket 61 is inserted through the connecting elastic plate 5. The first bracket 61 is provided with a first slot 62. One end of the connecting elastic plate 5 is fixedly connected to the upper terminal 3. Another end of the connecting elastic plate 5 is engaged with the first slot 62. A drive mechanism is provided above the connecting elastic plate 5 for driving the connecting elastic plate 5 downward.

When the drive mechanism of the present embodiment drives the connecting elastic plate 5 to be pressed downward, one end of the connecting elastic plate 5 is engaged with the first slot 62 to be immovable, and the other end connected with the upper terminal 3 is continuously pressed downward so that the connecting elastic plate 5 is deformed and curved. The upper terminal 3 is in contact with the lower terminal 4, and the circuit is closed. When the force from the drive mechanism to press the connecting elastic plate 5 disappears, the connecting elastic plate 5 is restored by means of its elasticity. The upper terminal 3 and the lower terminal 4 are disconnected and the circuit is disconnected. The structure is compact. Under the same condition of having the power adjustment function, the size of the push-button switch is reduced. The interior configuration of the push-button switch takes advantage of the principle of elastic deformation and restoration, so that the operator can complete the operation of the open circuit and closed circuit, without greater effort. The present invention has a labor-saving and ergonomic design.

In this embodiment, the drive mechanism includes a press block 71 for pressing the connecting elastic plate 5 downward, a push rod 72 for pushing the press block 71 downward, and a returning mechanism for returning the push rod 72. When the operator deactivates the push rod 72, the returning mechanism drives the push rod 72 to be returned, and the connecting elastic plate 5 is restored by means of its elasticity to move the press block 71 up.

In this embodiment, the press block 71 includes a press portion for pressing the connecting elastic plate 5 and a connecting portion for driving the push rod 72. A lower end of the push rod 72 is provided with a push block 721 for pushing the press block 71 downward. The connecting portion of the press block 71 has a contact curved surface. The push block 721 has an engaging bevel. The engaging bevel leans against the contact curved surface. When the push rod 72 is moved by the thrust, the engaging bevel of the push block 721 is moved to lean against the contact curved surface of the connecting portion of the press block 71 to press the press block 71 downward, and then the press block 71 presses the connecting elastic plate 5 downward.

In this embodiment, the returning mechanism includes a spring 73. One end of the spring 73 leans against the push rod 72. Another end of the spring 73 leans against an inner wall of the housing 1. After the operator deactivates the push rod 72, the push rod 72 biased by the spring 73 is returned.

In this embodiment, the drive mechanism further includes an auxiliary returning mechanism. The auxiliary returning mechanism includes a returning elastic piece 74. The connecting elastic plate 5 has a first receiving slot 51. The returning elastic piece 74 is disposed in the first receiving slot 51. The upper end of the support seat 6 is provided with a second bracket 63. The second bracket 63 is inserted through the connecting elastic plate 5. The second bracket 63 is provided with a second slot 64. One end of the returning elastic piece 74 is connected with the connecting elastic plate 5. Another end of the returning elastic piece 74 is engaged with the second slot 64. When one end of the connecting elastic plate 5, connected with the upper terminal 3, is moved downward, the returning elastic piece 74 is also deformed. When the downward press force is released, the connecting elastic sheet 5 and the returning elastic piece 74 are returned by means of their elasticity so that the upper terminal 3 is disengaged from the lower terminal 4 quickly.

In this embodiment, the power adjustment assembly includes a circuit board 81 and a slider 82 in contact with the circuit board 81. An upper end of the push rod 72 is provided with a second receiving slot. The slider 82 includes a fixed portion and a contact portion. The fixed portion of the slider 82 is disposed in the second receiving slot. The contact portion of the slider 82 is in contact with the circuit board 81. The slider 82 slides on the circuit board 81 during the pushing of the push rod 72 to adjust the power according to the slide distance.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A push-button switch capable of adjusting output power, comprising a housing (1), the housing (1) including a contact assembly and a power adjustment assembly therein, characterized by: the contact assembly including an upper terminal (3), a lower terminal (4) and a connecting elastic plate (5) below the upper terminal (3), a support seat (6) being provided in the housing (1), an upper end of the support seat (6) being provided with a first bracket (61), the first bracket (61) being inserted through the connecting elastic plate (5), the first bracket (61) being provided with a first slot (62), one end of the connecting elastic plate (5) being fixedly connected to the upper terminal (3), another end of the connecting elastic plate (5) being engaged with the first slot (62), a drive mechanism being provided above the connecting elastic plate (5) for driving the connecting elastic plate (5) downward,
  wherein the drive mechanism includes a press block (71) for pressing the connecting elastic plate (5) downward, a push rod (72) for pushing the press block (71) downward, and a returning mechanism for returning the push rod (72).

2. The push-button switch capable of adjusting output power as claimed in claim 1, wherein the press block (71) includes a press portion for pressing the connecting elastic plate (5) and a connecting portion for driving the push rod (72), and a lower end of the push rod (72) is provided with a push block (721) for pushing the press block (71) downward.

3. The push-button switch capable of adjusting output power as claimed in claim 2, wherein the connecting portion of the press block (71) has a contact curved surface, the push block (721) has an engaging bevel, and the engaging bevel leans against the contact curved surface.

4. The push-button switch capable of adjusting output power as claimed in claim 1, wherein the returning mechanism includes a spring (73), one end of the spring (73) leans against the push rod (72), and another end of the spring (73) leans against an inner wall of the housing (1).

5. The push-button switch capable of adjusting output power as claimed in claim 1, wherein the drive mechanism includes an auxiliary returning mechanism, the auxiliary returning mechanism includes a returning elastic piece (74), the connecting elastic plate (5) has a first receiving slot (51), the returning elastic piece (74) is disposed in the first receiving slot (51), the upper end of the support seat (6) is provided with a second bracket (63), the second bracket (63) is inserted through the connecting elastic plate (5), the second bracket (63) is provided with a second slot (64), one end of the returning elastic piece (74) is connected with the connecting elastic plate (5), and another end of the returning elastic piece (74) is engaged with the second slot (64).

6. The push-button switch capable of adjusting output power as claimed in claim 1, wherein the power adjustment assembly includes a circuit board (81) and a slider (82) in contact with the circuit board (81), an upper end of the push rod (72) is provided with a second receiving slot, the slider (82) includes a fixed portion and a contact portion, the fixed portion of the slider (82) is disposed in the second receiving slot, and the contact portion of the slider (82) is in contact with the circuit board (81).

* * * * *